United States Patent
Sakurai et al.

(10) Patent No.: US 12,108,676 B2
(45) Date of Patent: Oct. 1, 2024

(54) N-TYPE MATERIAL FOR THERMOELECTRIC CONVERSION, METHOD FOR PRODUCING SAME, DOPANT AND THERMOELECTRIC CONVERSION ELEMENT

(71) Applicant: Denka Company Limited, Tokyo (JP)

(72) Inventors: Yasuaki Sakurai, Tokyo (JP); Masahide Yamada, Tokyo (JP); Jun Watanabe, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 17/998,917

(22) PCT Filed: May 20, 2021

(86) PCT No.: PCT/JP2021/019217
§ 371 (c)(1),
(2) Date: Nov. 15, 2022

(87) PCT Pub. No.: WO2021/235526
PCT Pub. Date: Nov. 25, 2021

(65) Prior Publication Data
US 2023/0200242 A1    Jun. 22, 2023

(30) Foreign Application Priority Data
May 21, 2020  (JP) ................. 2020-088730

(51) Int. Cl.
*H10N 10/855* (2023.01)
*H10N 10/01* (2023.01)
*H10K 85/00* (2023.01)

(52) U.S. Cl.
CPC ........... *H10N 10/855* (2023.02); *H10N 10/01* (2023.02); *H10K 85/00* (2023.02)

(58) Field of Classification Search
CPC ..... H10N 10/01; H10N 10/855; H10N 10/857
See application file for complete search history.

(56) References Cited

U.S. PATENT DOCUMENTS

2014/0338715 A1 * 11/2014 Grunlan ............... H10N 10/855
977/948
2019/0081224 A1    3/2019 Yamada et al.

FOREIGN PATENT DOCUMENTS

| EP | 1819005 A1 * | 8/2007 | .......... H01G 9/2013 |
|----|----|----|----|
| JP | 2013-098299 A | 5/2013 | |
| JP | 2015-115447 A | 6/2015 | |
| JP | 2016-157942 A | 9/2016 | |
| WO | WO 2015/198980 A1 | 12/2015 | |
| WO | WO 2016/052514 A1 | 4/2016 | |
| WO | WO 2017/155046 A1 | 9/2017 | |
| WO | WO 2018/142748 A1 | 8/2018 | |
| WO | WO 2018/147126 A1 | 8/2018 | |
| WO | WO 2019/208753 A1 | 10/2019 | |

OTHER PUBLICATIONS

English Translation of Kawai et al., JP2016-157942 (Year: 2016).*
The International Bureau of WIPO, International Preliminary Report on Patentability issued in International Application No. PCT/JP2021/019217 (Dec. 1, 2022).
Japan Patent Office, International Search Report issued in International Application No. PCT/JP2021/019217 (Aug. 24, 2021).
European Patent Office, Extended European Search Report issued in European Patent Application No. 21809619.6 (Oct. 9, 2023).

* cited by examiner

*Primary Examiner* — Golam Mowla
(74) *Attorney, Agent, or Firm* — Leydig, Voit & Mayer, Ltd.

(57) ABSTRACT

An n-type material for thermoelectric conversion obtained by doping a p-type material for thermoelectric conversion with a dopant, the p-type material for thermoelectric conversion containing a carbon nanotube and a conductive resin, in which the dopant contains an anion that is a complex ion, an alkali metal cation, and a cation scavenger.

8 Claims, No Drawings

N-TYPE MATERIAL FOR THERMOELECTRIC CONVERSION, METHOD FOR PRODUCING SAME, DOPANT AND THERMOELECTRIC CONVERSION ELEMENT

CROSS-REFERENCE TO RELATED APPLICATIONS

This patent application is the U.S. national phase of International Application No. PCT/JP2021/019217, filed on May 20, 2021, which claims the benefit of Japanese Patent Application No. 2020-088730, filed May 21, 2020, the disclosures of which are incorporated herein by reference in their entireties for all purposes.

TECHNICAL FIELD

The present invention relates to an n-type material for thermoelectric conversion, a method for producing the same, a dopant, and a thermoelectric conversion element.

BACKGROUND ART

Thermoelectric conversion is a technique for directly converting heat into electricity by utilizing a Seebeck effect and draws attention as an energy recovery technique for converting waste heat or the like generated when fossil fuel is used into electricity.

A thermoelectric conversion element used in the above-described field is preferably a bipolar element which includes both a material exhibiting p-type conductivity and a material exhibiting n-type conductivity, but nanomaterials often exhibit p-type conductivity. Therefore, there is a demand for a technique for converting a nanomaterial exhibiting p-type conductivity into a nanomaterial exhibiting n-type conductivity.

For example, Patent Literature 1 discloses an n-type dopant for converting a nanomaterial exhibiting p-type conductivity into a nanomaterial exhibiting n-type conductivity.

Note that, whether a nanomaterial exhibits p-type conductivity or n-type conductivity can be determined depending on whether a Seebeck coefficient is positive or negative (when the Seebeck coefficient is positive, the nanomaterial exhibits p-type conductivity, and when the Seebeck coefficient is negative, the nanomaterial exhibits n-type conductivity).

CITATION LIST

Patent Literature

Patent Literature 1: International Publication WO 2015/198980

SUMMARY OF INVENTION

Technical Problem

An object of the present invention is to provide a thermoelectric conversion element having excellent thermoelectric conversion performance and an n-type material for thermoelectric conversion capable of realizing the thermoelectric conversion element. Furthermore, an object of the present invention is to provide a novel dopant capable of forming the above-described n-type material for thermoelectric conversion and a method for producing the above-described n-type material for thermoelectric conversion.

Solution to Problem

An aspect of the present invention relates to an n-type material for thermoelectric conversion obtained by doping a p-type material for thermoelectric conversion with a dopant, the p-type material for thermoelectric conversion containing a carbon nanotube and a conductive resin, in which the dopant contains an anion that is a complex ion, an alkali metal cation, and a cation scavenger.

In an embodiment, the anion may be selected from the group consisting of ferrocyanide ions, ferricyanide ions, tetrachloroferrate(III) ions, and tetrachloroferrate(II) ions.

In the embodiment, the anion may include an iron atom, and a content of the iron atom in the n-type material for thermoelectric conversion may be 0.001% by mass to 15% by mass.

In the embodiment, the cation scavenger may be a crown ether-based compound.

In the embodiment, the cation scavenger may be a crown ether-based compound having a benzene ring in the molecule.

In the embodiment, the conductive resin may be configured by poly(3,4-ethylenedioxythiophene) and an electron acceptor.

Another aspect of the present invention relates to a dopant doped in a p-type material for thermoelectric conversion and used for n-type conversion of the p-type material for thermoelectric conversion, the p-type material for thermoelectric conversion containing a carbon nanotube and a conductive resin, the dopant containing: an anion that is a complex ion; an alkali metal cation; and a cation scavenger.

Still another aspect of the present invention relates to a method for producing an n-type material for thermoelectric conversion, the method including a step of doping a p-type material for thermoelectric conversion with a dopant, the p-type material for thermoelectric conversion containing a carbon nanotube and a conductive resin, in which the dopant contains an anion that is a complex ion, an alkali metal cation, and a cation scavenger.

In an embodiment, the step may include: an impregnation step of impregnating at least a part of the p-type material for thermoelectric conversion with a dopant solution containing the dopant and a solvent; and a solvent removal step of removing the solvent.

In the embodiment, the step of doping a p-type material for thermoelectric conversion with a dopant may include: an impregnation step of impregnating a part of a resin layer containing the p-type material for thermoelectric conversion with a dopant solution containing the dopant and a solvent; and a solvent removal step of removing the solvent to obtain a thermoelectric conversion layer containing the p-type material for thermoelectric conversion and an n-type material for thermoelectric conversion.

Still another aspect of the present invention relates to a thermoelectric conversion element including the above-described n-type material for thermoelectric conversion.

In an embodiment, the thermoelectric conversion element may further include the p-type material for thermoelectric conversion.

Advantageous Effects of Invention

According to the present invention, it is possible to provide a thermoelectric conversion element having excellent thermoelectric conversion performance and an n-type material for thermoelectric conversion capable of realizing the thermoelectric conversion element. Furthermore, according to the present invention, it is possible to provide a novel dopant capable of forming the above-described n-type material for thermoelectric conversion and a method for producing the above-described n-type material for thermoelectric conversion.

DESCRIPTION OF EMBODIMENTS

Hereinafter, preferred embodiments of the present invention will be specifically described.
<N-Type Material for Thermoelectric Conversion>
An n-type material for thermoelectric conversion of the present embodiment is obtained by doping a p-type material for thermoelectric conversion with a dopant.
(P-Type Material for Thermoelectric Conversion)
The p-type material for thermoelectric conversion contains a carbon nanotube and a conductive resin.

The carbon nanotube may be any of a single-layer carbon nanotube, a two-layer carbon nanotube, and a multi-layer carbon nanotube, but is preferably a single-layer carbon nanotube from the viewpoint of further improving the electric conductivity of a thermoelectric conversion material.

The carbon nanotube preferably includes a single-layer carbon nanotube. The content ratio of the single-layer carbon nanotube with respect to the total amount of the carbon nanotube is, for example, preferably 25% by mass or more and more preferably 50% by mass or more, and may be 100% by mass. That is, the content ratio of the single-layer carbon nanotube with respect to the total amount of the carbon nanotube may be, for example, 25 to 100% by mass or 50 to 100% by mass.

The diameter of the single-layer carbon nanotube is not particularly limited, and may be, for example, 20 nm or less and is preferably 10 nm or less and more preferably 3 nm or less. Note that, the lower limit of the diameter of the single-layer carbon nanotube is not particularly limited, and may be, for example, 0.4 nm or more and may be 0.5 nm or more. That is, the diameter of the single-layer carbon nanotube may be, for example, 0.4 to 20 nm, 0.4 to 10 nm, 0.4 to 3 nm, 0.5 to 20 nm, 0.5 to 10 nm, or 0.5 to 3 nm.

In the present specification, the diameter of the single-layer carbon nanotube can be determined by formula: Diameter (nm)=248/ω from the wave number ($\omega$(cm$^{-1}$)) of a peak appearing at 100 to 300 cm$^{-1}$ by Raman spectroscopy.

As a method for evaluating the single-layer carbon nanotube, a G/D ratio by laser Raman spectroscopy is known. In the present embodiment, the G/D ratio of the single-layer carbon nanotube in laser Raman spectroscopy at a wavelength of 532 nm is preferably 10 or more and more preferably 20 or more. By using such a single-layer carbon nanotube, there is a tendency that a thermoelectric conversion material having further excellent electric conductivity is obtained. Note that, the upper limit of the G/D ratio is not particularly limited, and may be, for example, 500 or less and may be 300 or less. That is, the G/D ratio may be, for example, 10 to 500, 10 to 300, 20 to 500, or 20 to 300.

The content of the carbon nanotube may be, for example, 20 parts by mass or more, and is preferably 30 parts by mass or more and more preferably 40 parts by mass or more, with respect to 100 parts by mass of the p-type material for thermoelectric conversion.

Furthermore, the content of the carbon nanotube may be, for example, 99 parts by mass or less, and is preferably 95 parts by mass or less and more preferably 90 parts by mass or less, with respect to 100 parts by mass of the p-type material for thermoelectric conversion. That is, the content of the carbon nanotube may be, for example, 20 to 99 parts by mass, 20 to 95 parts by mass, 20 to 90 parts by mass, 30 to 99 parts by mass, 30 to 95 parts by mass, 30 to 90 parts by mass, 40 to 99 parts by mass, 40 to 95 parts by mass, or 40 to 90 parts by mass, with respect to 100 parts by mass of the p-type material for thermoelectric conversion.

The conductive resin of the present embodiment is not particularly limited, and a known conductive resin that is used for the p-type material for thermoelectric conversion can be used without particular limitation. Examples of the conductive resin include those including a polyaniline-based conductive polymer, a polythiophene-based conductive polymer, a polypyrrole-based conductive polymer, a polyacetylene-based conductive polymer, a polyphenylene-based conductive polymer, a polyphenylenevinylene-based conductive polymer, and the like. As the polythiophene-based conductive polymer, poly(3,4-ethylenedioxythiophene) can be exemplified.

As the conductive resin of the present embodiment, a conductive resin, which is configured by poly(3,4-ethylenedioxythiophene) (hereinafter, referred to as PEDOT in some cases) and an electron acceptor, is preferred. When the conductive resin of the present embodiment is such a conductive resin, there is a tendency that the electric conductivity of a thermoelectric conversion material is further enhanced.

Examples of the electron acceptor include polystyrene sulfonic acid, polyvinyl sulfonic acid, poly(meth)acrylic acid, polyvinyl sulfonic acid, toluenesulfonic acid, dodecylbenzenesulfonic acid, camphorsulfonic acid, bis(2-ethylhexyl) sulfosuccinate, chlorine, bromine, iodine, phosphorus pentafluoride, arsenic pentafluoride, boron trifluoride, hydrogen chloride, sulfuric acid, nitric acid, tetrafluoroboric acid, perchloric acid, iron(III) chloride, tetracyanoquinodimethane, and the like. From the viewpoint of further improving the electric conductivity of a thermoelectric conversion material, as the electron acceptor, polystyrene sulfonic acid (hereinafter, referred to as PSS in some cases) is preferred.
(Dopant)
In the present specification, the dopant means a substance which changes a Seebeck coefficient of a material to be doped with the dopant.

In the present specification, the expression "changing a Seebeck coefficient" means decreasing a Seebeck coefficient value or changing a Seebeck coefficient value from a positive value to a negative value. A thermoelectric conversion material having a positive Seebeck coefficient value has p-type conductivity, and a thermoelectric conversion material having a negative Seebeck coefficient value has an n-type conductivity. The Seebeck coefficient can be measured, for example, by a measurement method in Examples described below, and the polarity of a thermoelectric conversion material can be determined on whether the measured value is positive or negative.

The dopant of the present embodiment contains an anion that is a complex ion (hereinafter, also simply referred to as "anion"), an alkali metal cation (hereinafter, also simply referred to as "cation"), and a cation scavenger (hereinafter, also simply referred to as "scavenger"). By doping a carbon nanotube exhibiting p-type conductivity with the dopant, the Seebeck coefficient of the carbon nanotube is changed so that a carbon nanotube exhibiting n-type conductivity can be obtained.

The reason why the above-described effect is exhibited is not particularly limited, and is conceivable that the scavenger contained in the dopant captures the cation to dissociate the anion and the anion changes a carrier of the carbon nanotube from a hole to an electron. At this time, in the present embodiment, since the anion is a complex ion having a metal atom at the center, it is conceivable that the n-type conversion is significantly performed by an interaction between the metal atom and the carbon nanotube, and it is also conceivable to exhibit the above-described effect because the ionic size of the complex ion is large so that the dissociability of the complex ion from the cation captured by the scavenger is favorable.

Furthermore, in the dopant of the present embodiment, since the anion is a complex ion, the metal atom derived from the complex ion remains in the n-type material for thermoelectric conversion. Therefore, in the present embodiment, the metal atom remaining in the n-type material for thermoelectric conversion functions as an antioxidant, and effects of suppressing a change in physical properties over time and improving the storage stability are also exhibited.

The anion that is a complex ion may be an anion selected from the group consisting of ferrocyanide ions, ferricyanide ions, tetrachloroferrate(III) ions, tetrachloroferrate(II) ions, tetracyanonickelate(II) ions, tetrachloronickelate(II) ions, tetracyanocobaltate(II) ions, tetrachlorocobaltate(II) ions, tetracyanocuprate(I) ions, tetrachlorocuprate(II) ions, hexacyanochromate(III) ions, tetrahydroxidozincate(II) ions, and tetrahydroxidoaluminate(III) ions. Among these, ferrocyanide ions are preferred. When the anion is a ferrocyanide ion, an n-type material for thermoelectric conversion having more favorable properties is obtained.

Furthermore, when the anion is a ferrocyanide ion, the iron atom remaining in the n-type material for thermoelectric conversion suitably functions as an antioxidant, and there are tendencies that a change in physical properties over time is further suppressed and the storage stability is further improved.

The anion that is a complex ion may include an iron atom, and for example, is preferably selected from the group consisting of ferrocyanide ions, ferricyanide ions, tetrachloroferrate(III) ions, and tetrachloroferrate(II) ions. From the viewpoint of obtaining an n-type material for thermoelectric conversion having more favorable properties, the anion including an iron atom is preferably a ferrocyanide ion. Furthermore, the content of the iron atom in the n-type material for thermoelectric conversion is preferably 0.0010% by mass to 15% by mass, more preferably 0.005% by mass to 12% by mass, and further preferably 0.01% by mass to 10% by mass, from the viewpoint of the antioxidant effect. The content of the iron atom in the n-type material for thermoelectric conversion may be, for example, 0.001 to 12% by mass, 0.001 to 10% by mass, 0.005 to 15% by mass, 0.005 to 10% by mass, 0.01 to 15% by mass, or 0.01 to 12% by mass. Note that, in the present specification, the content of the iron atom indicates a value measured by scanning electron microscope (SEM)-energy dispersive X-ray spectroscopy (EDS).

The anion may be an anion generated by disassociation of a complex salt in a dopant solution. Examples of the complex salt include potassium ferrocyanide, sodium ferrocyanide, potassium ferricyanide, sodium ferricyanide, potassium tetrachloroferrate(III), sodium tetrachloroferrate(III), potassium tetrachloroferrate(II), sodium tetrachloroferrate(II), and the like. The complex salt may be a hydrate.

Examples of the alkali metal cation include a sodium ion, a potassium ion, a lithium ion, and the like.

The cation scavenger is not particularly limited as long as it is a substance which is capable of taking in a cation. Examples thereof include a crown ether-based compound, cyclodextrin, calixarene, ethylenediaminetetraacetate, porphyrin, phthalocyanine, derivatives thereof, and the like. In an organic solvent, a crown ether-based compound is preferably used.

Examples of the crown ether-based compound include 15-crown-5-ether, 18-crown-6-ether, 12-crown-4-ether, benzo-18-crown-6-ether, benzo-15-crown-5-ether, benzo-12-crown-4-ether, and the like. In the crown ether to be used as a scavenger, the ring size may be selected in accordance with a size of a metal ion to be taken in. For example, in a case where the metal ion is a potassium ion, an 18-membered crown ether is preferred; in a case where the metal ion is a sodium ion, a 15-membered crown ether is preferred; and in a case where the metal ion is a lithium ion, a 12-membered crown ether is preferred.

The crown ether-based compound preferably has a benzene ring in the molecule. By using such a crown ether-based compound, there are tendencies that the p-type conversion by oxidation is suppressed and the storage stability is further improved. Examples of the crown ether-based compound having a benzene ring include benzo-18-crown-6-ether, benzo-15-crown-5-ether, benzo-12-crown-4-ether, and the like.

A molar ratio ($C_2/C_1$) of a content $C_2$ of the scavenger with respect to a content $C_1$ of the cation may be, for example, 0.1 to 5, and is preferably 0.3 to 3 and more preferably 0.5 to 2. The molar ratio ($C_2/C_1$) may be, for example, 0.1 to 3, 0.1 to 2, 0.3 to 5, 0.3 to 2, 0.5 to 5, or 0.5 to 3.

The dopant of the present embodiment may include a substance as necessary, in addition to the anion, the cation, and the scavenger which are described above. Such a substance is not particularly limited as long as it does not inhibit an action of the dopant, and examples thereof include water, an organic solvent, and the like.

The dopant of the present embodiment may include a plurality of kinds of the anion, the cation, and the scavenger, respectively.

A method for producing a thermoelectric conversion material of the present embodiment is not particularly limited, and the thermoelectric conversion material can be produced, for example, by the following method.

<Method for Producing n-Type Material for Thermoelectric Conversion>

A production method of the present embodiment includes a step of doping a p-type material for thermoelectric conversion with a dopant, the p-type material for thermoelectric conversion containing a carbon nanotube and a conductive resin. The above-described step is also referred to as an n-type conversion step.

The method of doping a p-type material for thermoelectric conversion with a dopant in the n-type conversion step is not particularly limited, and examples thereof include a method of bringing a dopant solution containing a dopant into contact with a p-type material for thermoelectric conversion.

In a preferred embodiment, the n-type conversion step may include an impregnation step of impregnating at least a part of the p-type material for thermoelectric conversion with a dopant solution containing the dopant and a solvent, and a solvent removal step of removing the solvent from the material obtained after the dopant solution impregnation.

The boiling point of the solvent is preferably 70° C. or higher, more preferably 90° C. or higher, and further preferably 110° C. or higher, and may be 150° C. or higher. In the case of performing a heating treatment in the solvent removal step described below, when the boiling point of the solvent is low, most of the solvent is removed at the initial stage of the heating treatment, and thus the effect of the heating treatment may be not sufficiently exhibited in some cases. When a solvent having the above-described preferable boiling point range is used, the effect of the heating treatment is more significantly exhibited. The upper limit of the boiling point of the solvent is not particularly limited. The boiling point of the solvent may be, for example, 300° C. or lower, and may be 250° C. or lower. That is, the boiling point of the solvent may be, for example, 70 to 300° C., 70 to 250° C., 90 to 300° C., 90 to 250° C., 110 to 300° C., 110 to 250° C., 150 to 300° C., or 150 to 250° C.

Examples of the solvent include water, acetonitrile, ethanol, ethylene glycol, dimethyl sulfoxide (DMSO), N-methylpyrrolidone, N,N-dimethylformamide, N,N-dimethylacetamide, and the like. Note that, the solvent may be used alone or as a mixture of two or more kinds thereof.

The dopant solution of the present embodiment may include other components to the extent that the effects of the present invention are not impaired, in addition to the dopant and the solvent. Examples of the other components include a binder resin, an antioxidant, a thickener, a surfactant, and the like.

The method of impregnating the p-type material for thermoelectric conversion with a dopant solution is not particularly limited, and examples thereof include methods such as immersing the p-type material for thermoelectric conversion into a dopant solution and applying a dopant solution to the p-type material for thermoelectric conversion. Among these, from the viewpoint that the p-type material for thermoelectric conversion can be easily exposed to a dopant solution while the shape of the p-type material for thermoelectric conversion is maintained, a method of immersing the p-type material for thermoelectric conversion into a dopant solution is preferred.

The dopant of the present embodiment is excellent in doping efficiency, and thus doping can be completed in a short time. The time for impregnating the p-type material for thermoelectric conversion with a dopant solution may be, for example, 10 minutes to 72 hours, and may be 30 minutes to 24 hours. When the time for impregnation of the dopant solution is within the above range, the productivity of the n-type material for thermoelectric conversion is excellent.

Herein, in the present embodiment, the conductive resin is included in order to obtain an excellent p-type material for thermoelectric conversion; on the other hand, there is a concern that the conductive resin prevents the dopant from being in contact with the carbon nanotube. Furthermore, with this concern, it is necessary to require time and effort such as a long-time doping process of the p-type material for thermoelectric conversion and shear dispersion of the p-type material for thermoelectric conversion in a dopant treatment solution. The dopant of the present invention resolves such time and effort and can provide an n-type material having excellent thermoelectric conversion performance for a short impregnating time of about 10 minutes.

In the impregnation step, a material impregnated with the dopant solution is obtained, and this material is provided to the solvent removal step. Note that, the solvents used in the impregnation step other than those which are impregnated in or adhere to the material may be removed at the final stage of the impregnation step. For example, in a case where the p-type material for thermoelectric conversion is immersed into a dopant solution in the impregnation step, the material may be taken out from the dopant solution and then provided to the solvent removal step.

In the solvent removal step, at least a part of the solvent is removed from the material obtained after the above-described dopant solution impregnation. In the solvent removal step, it is not necessary to remove the whole solvent, and the solvent may remain to the extent that the material sufficiently functions as an n-type material for thermoelectric conversion.

The solvent removal step may be, for example, a step of removing the solvent by natural drying, and may be a step of removing the solvent by performing a heating treatment, a decompression treatment, or the like.

In a preferred embodiment, the solvent removal step may include a step of subjecting the thermoelectric conversion material impregnated with the solvent to a heating treatment. In the present embodiment, it is conceivable that voids between the carbon nanotubes are filled so as to form a denser structure by the solvent, which has improved compatibility with the conductive resin by heating, causing the conductive resin in the material to flow. Therefore, in the present embodiment, there is a tendency that thermoelectric conversion properties are more significantly improved.

In the present embodiment, the temperature of the heating treatment is not particularly limited, and may be, for example, 40° C. or higher, and is preferably 50° C. or higher and more preferably 60° C. or higher. By increasing the temperature of the heating treatment, there is a tendency that the Seebeck coefficient of the thermoelectric conversion material is improved. Furthermore, the temperature of the heating treatment may be, for example, 250° C. or lower, and is preferably 225° C. or lower and more preferably 200° C. or lower. By decreasing the temperature of the heating treatment, there is a tendency that the electric conductivity of the thermoelectric conversion material is improved. In the present embodiment, there is a tendency that the Seebeck coefficient and the electric conductivity vary depending on the temperature of the heating treatment. Therefore, the temperature of the heating treatment may be appropriately selected, for example, within the above-described range in view of a balance between numerical values of the Seebeck coefficient and the electric conductivity. The temperature of the heating treatment may be, for example, 40 to 250° C., 40 to 220° C., 40 to 200° C., 50 to 250° C., 50 to 220° C., 50 to 200° C., 60 to 250° C., 60 to 220° C., or 60 to 200° C.

In the present embodiment, the time for the heating treatment is not particularly limited. The time for the heating treatment may be, for example, 1 minute or longer and is preferably 10 minutes or longer, and may be 12 hours or shorter and is preferably 6 hours or shorter. That is, the time for the heating treatment may be, for example, 1 minute to 12 hours, 1 minute to 6 hours, 10 minutes to 12 hours, or 10 minutes to 6 hours.

Note that, the heating treatment in the present embodiment is not necessarily performed for removing the solvent, and the solvent removal step according to the present embodiment may be a step of further performing a treatment of removing the solvent after the heating treatment.

In the present embodiment, a part doped with the dopant of the p-type material for thermoelectric conversion becomes an n-type material for thermoelectric conversion. In the present embodiment, the entire p-type material for thermoelectric conversion may be doped with the dopant to obtain an n-type material for thermoelectric conversion, and a part of the p-type material for thermoelectric conversion may be doped with the dopant to obtain a composite body of the p-type material for thermoelectric conversion and an n-type material for thermoelectric conversion.

In a preferred embodiment, the impregnation step may be a step of impregnating a part of a resin layer containing the p-type material for thermoelectric conversion with a dopant solution containing the dopant and a solvent, and the solvent removal step may be a step of removing the solvent from the resin layer obtained after the dopant solution impregnation to obtain a thermoelectric conversion layer containing the p-type material for thermoelectric conversion and an n-type material for thermoelectric conversion. According to such an embodiment, a thermoelectric conversion layer containing a p-type material and an n-type material can be easily obtained. Furthermore, in such an embodiment, the range of the impregnation of the dopant solution in the impregnation step is appropriately set so that a thermoelectric conversion layer having a desired p/n configuration can be easily obtained.

The shape of the n-type material for thermoelectric conversion is not particularly limited. For example, the n-type material for thermoelectric conversion may be obtained as a film supported by a support by subjecting a composite material in which the film of the p-type material for thermoelectric conversion is formed on a support to a doping process.

Examples of the support include polyimide, polyethylene terephthalate, polyethylene naphthalate, polyethylene isophthalate, polybutylene telephthalate, polycarbonate, polyether ether ketone, polyphenylsulfide, polysulfone, glass, copper, silver, gold, aluminum, and the like. Among these, from the viewpoint that the obtained thermoelectric conversion material exhibits favorable plasticity, the support is preferably selected from the group consisting of polyimide, polyethylene terephthalate, and polyethylene naphthalate.

The film thickness of the n-type material for thermoelectric conversion is preferably 100 nm to 1 mm, more preferably 200 nm to 800 μm, and further preferably 300 nm to 600 μm, from the viewpoint of obtaining appropriate electric resistance and excellent flexibility. That is, the film thickness of the n-type material for thermoelectric conversion may be, for example, 100 nm to 1 mm, 100 nm to 800 μm, 100 nm to 600 μm, 200 nm to 1 mm, 200 nm to 800 μm, 200 nm to 600 μm, 300 nm to 1 mm, 300 nm to 800 μm, or 300 nm to 600 μm.

The thermoelectric conversion material according to the present embodiment can be suitably used as a thermoelectric conversion material for a thermoelectric conversion element. Furthermore, the thermoelectric conversion material according to the present embodiment can also be suitably used for use applications such as a Peltier element and a temperature sensor.

<Thermoelectric Conversion Element>

A thermoelectric conversion element according to the present embodiment includes two conductive substrates, and a thermoelectric conversion layer disposed between the conductive substrates and containing the thermoelectric conversion material. Such a thermoelectric conversion element is excellent in thermoelectric conversion properties since the thermoelectric conversion material obtained by the above-described production method is used.

The two conductive substrates can also be called a first electrode and a second electrode, respectively.

The thermoelectric conversion element according to the present embodiment may be produced, for example, by a production method including a lamination step of disposing the thermoelectric conversion material between two conductive substrates.

The lamination step may be executed, for example, by forming a layer of the thermoelectric conversion material (thermoelectric conversion layer) on one of conductive substrates and laminating the other of conductive substrates on the formed thermoelectric conversion layer. Furthermore, the lamination step may be executed, for example, by preparing a film-shaped thermoelectric conversion material and pasting two conductive substrates to both surfaces of the film-shaped thermoelectric conversion material.

The thermoelectric conversion element may further include configuration other than the above. For example, the thermoelectric conversion element may further include a sealing material for sealing the thermoelectric conversion material, a wiring for electrically connecting thermoelectric conversion elements to each other or for taking out electric power to an external circuit, a heat insulation material or thermal conductive material for controlling the thermal conductivity of the thermoelectric conversion element, and the like.

Hereinbefore, preferred embodiments of the present invention have been described, but the present invention is not intended to be limited to the above-described embodiment.

EXAMPLES

Example 1

(Preparation of Liquid Mixture)

Hereinafter, preparation was performed at 27° C. unless otherwise specified. 0.28 g of "Clevious PH1000" (PEDOT/

PSS aqueous dispersion, solid content concentration: 1.2% by mass) manufactured by Heraeus Holding and 5 g of "EC-DH" (single-layer carbon nanotube aqueous dispersion, single-layer CNT concentration: 0.2% by mass, diameter of the single-layer CNT: 1.4 nm, G/D ratio: 100) manufactured by MEIJO NANO CARBON Co., Ltd. were stirred and mixed with a planetary centrifugal mixer ("THINKY MIXER ARE-310" manufactured by THINKY CORPORATION) to prepare a liquid mixture in which the content of the single-layer CNT is 75% by mass with respect to the total amount of PEDOT/PSS and the single-layer CNT. The term "PEDOT/PSS" refers to a conductive polymer composed of PEDOT and PSS.

(Production of Composite Material)

About 1.5 mL of the liquid mixture was dropped onto a polyimide film (thickness: 100 μm) washed with acetone, and the liquid mixture was applied to the film using a doctor blade with a gap of 2 mm and dried at 60° C. for 3 hours to produce a composite material having a thickness of 25 μm.

(Solvent Treatment and Solvent Removal)

The composite material was subjected to an immersion treatment in dimethyl sulfoxide (DMSO, boiling point: 189° C.) at room temperature for 5 minutes. Thereafter, the composite body was subjected to a heating treatment at 60° C. for 30 minutes to produce a p-type material for thermoelectric conversion having a thickness of 5 μm. The Seebeck coefficient of the obtained p-type material for thermoelectric conversion was 24.8 μV/K.

(Production of n-Type Material for Thermoelectric Conversion)

In 3 mL of ultrapure water, 0.032 g of potassium ferrocyanide trihydrate and 0.094 g of benzo-18-crown-6-ether were dissolved (concentration of each of potassium ions and benzo-18-crown-6-ether: 0.1 M, $C_2/C_1=1$) to obtain a dopant solution. The obtained thermoelectric conversion material was cut into 15 mm×15 mm, and subjected to an immersion treatment in the dopant solution at room temperature for 10 minutes. Thereafter, the thermoelectric conversion material was pulled up from the dopant solution and subjected to a heating treatment at 60° C. for 30 minutes to produce a doped thermoelectric conversion material.

The Seebeck coefficient of the doped thermoelectric conversion material thus obtained was −17.4 μV/K.

(Calculation of Seebeck Coefficient)

A polyimide plate coated with the doped thermoelectric conversion material was cut into 20 mm×10 mm, one end of the longer side of a test piece was cooled (5° C.), the other end of the longer side of the test piece was heated (5° C.), the temperature difference and voltage generated at both ends were measured with an alumel-chromel thermocouple, and the Seebeck coefficient was calculated from the inclination of the temperature difference and the voltage. Also for a polyimide plate coated with the thermoelectric conversion material before the doping process, the Seebeck coefficient was calculated by the same method.

Example 2

An n-type material for thermoelectric conversion was obtained in the same manner as in Example 1, except that sodium ferrocyanide trihydrate was used instead of potassium ferrocyanide trihydrate, and benzo-15-crown-5-ether was used instead of benzo-18-crown-6-ether.

Comparative Example 1

The p-type material for thermoelectric conversion was doped with a dopant in the same manner as in Example 1, except that potassium carbonate was used instead of potassium ferrocyanide trihydrate.

Comparative Example 2

The p-type material for thermoelectric conversion was doped with a dopant in the same manner as in Example 2, except that sodium bicarbonate was used instead of sodium ferrocyanide trihydrate.

Comparative Example 3

The p-type material for thermoelectric conversion was doped with a dopant in the same manner as in Example 2, except that sodium carbonate was used instead of sodium ferrocyanide trihydrate.

Seebeck coefficient values before and after the doping process are shown in Table 1. Examples 1 and 2 show a negative Seebeck coefficient after the doping process and show the performance as the n-type material for thermoelectric conversion. Comparative Examples 1 to 3 show a positive Seebeck coefficient after the doping process and do not show the performance as the n-type material for thermoelectric conversion.

TABLE 1

|  | Example 1 | Example 2 | Comparative Example 1 | Comparative Example 2 | Comparative Example 3 |
| --- | --- | --- | --- | --- | --- |
| Before doping process | 24.8 | 25.8 | 24.7 | 25.5 | 25.2 |
| After doping process | −17.4 | −4.7 | 12.3 | 21.8 | 24.4 |

The invention claimed is:

1. An n-type material for thermoelectric conversion obtained by doping a p-type material for thermoelectric conversion with a dopant, the p-type material for thermoelectric conversion containing a carbon nanotube and a conductive resin, wherein
the dopant contains an anion that is a complex ion, an alkali metal cation, and a cation scavenger, and wherein the anion includes an iron atom.

2. The n-type material for thermoelectric conversion according to claim 1, wherein the anion is selected from the group consisting of ferrocyanide ions, ferricyanide ions, tetrachloroferrate(III) ions, and tetrachloroferrate(II) ions.

3. The n-type material for thermoelectric conversion according to claim 1, wherein a content of the iron atom in the n-type material for thermoelectric conversion is 0.001% by mass to 15% by mass.

4. The n-type material for thermoelectric conversion according to claim 1, wherein the cation scavenger is a crown ether-based compound.

5. The n-type material for thermoelectric conversion according to claim 1, wherein the cation scavenger is a crown ether-based compound having a benzene ring in the molecule.

6. The n-type material for thermoelectric conversion according to claim 1, wherein the conductive resin is configured by poly(3,4-ethylenedioxythiophene) and an electron acceptor.

7. A thermoelectric conversion element comprising the n-type material for thermoelectric conversion according to claim 1.

8. The thermoelectric conversion element according to claim 7, further comprising the p-type material for thermoelectric conversion.

* * * * *